(12) United States Patent
Kuo et al.

(10) Patent No.: US 7,671,355 B2
(45) Date of Patent: Mar. 2, 2010

(54) METHOD OF FABRICATING A PHASE CHANGE MEMORY AND PHASE CHANGE MEMORY

(75) Inventors: Chien-Li Kuo, Hsinchu (TW); Kuei-Sheng Wu, Tainan County (TW); Yung-Chang Lin, Tai-Chung Hsien (TW)

(73) Assignee: United Microelectronics Corp., Hsin-Chu (TW)

( * ) Notice: Subject to any disclaimer, the term of this patent is extended or adjusted under 35 U.S.C. 154(b) by 100 days.

(21) Appl. No.: 12/053,623

(22) Filed: Mar. 24, 2008

(65) Prior Publication Data

US 2009/0236583 A1    Sep. 24, 2009

(51) Int. Cl.
*H01L 29/04* (2006.01)

(52) U.S. Cl. ............ 257/3; 257/4; 257/5; 257/E29.276; 365/100; 365/148; 438/197; 438/900

(58) Field of Classification Search .................. 257/1–8, 257/289, E29.276; 365/100, 148; 338/13; 438/900, 197
See application file for complete search history.

(56) References Cited

U.S. PATENT DOCUMENTS

| 7,005,665 | B2 * | 2/2006 | Furkay et al. ................... 257/2 |
| 2007/0076486 | A1 | 4/2007 | Jeong et al. |
| 2007/0164266 | A1 | 7/2007 | Choi |
| 2009/0001341 | A1 * | 1/2009 | Breitwisch et al. ............. 257/4 |
| 2009/0180314 | A1 * | 7/2009 | Liu ............................. 365/163 |

* cited by examiner

*Primary Examiner*—Evan Pert
*Assistant Examiner*—Scott R Wilson
(74) *Attorney, Agent, or Firm*—Winston Hsu (57) ABSTRACT

The present invention relates to a phase change memory and a method of fabricating a phase change memory. The phase change memory includes a heater structure disposed on a phase change material pattern, wherein the heater structure is in a tapered shape with a bottom portion contacting the phase change material pattern. The fabrication of the phase change memory is compatible with the fabrication of logic devices, and accordingly an embedded phase change memory can be fabricated.

19 Claims, 7 Drawing Sheets

METHOD OF FABRICATING A PHASE CHANGE MEMORY AND PHASE CHANGE MEMORY

BACKGROUND OF THE INVENTION

1. Field of the Invention

The present invention relates to a method of fabricating a phase change memory (PCM) and a phase change memory thus formed, and particularly to a phase change memory with a heater structure in a tapered shape.

2. Description of the Prior Art

A PCM is a memory device using the phase change capability of so-called phase change material whose phase would change in response to external thermal stress, e.g., amorphous to crystalline, as a mechanism to store data. The amorphous state of the phase change material generally exhibits greater specific resistance than the crystalline state, and using this difference of specific resistance it is possible to determine whether data recorded by the phase change material is a logic "1" or a logic "0" by detecting a voltage change and/or a current change caused by difference of this specific resistance.

A representative example of a phase change material may include a compound containing germanium (Ge), tellurium (Te) and stibium (Sb)—generally referred to as GST. A PCM using this phase change material can have benefits of being non-volatile and with a data retention of more than 10 years, a short written time of less than 100 nanoseconds, and a low write power of, for example, 3V×1 mA. Another benefit of PCM memory is its high durability to allow billions of cycles of data writing and erasing. In addition, a PCM device has a good scalability.

Figure 1:
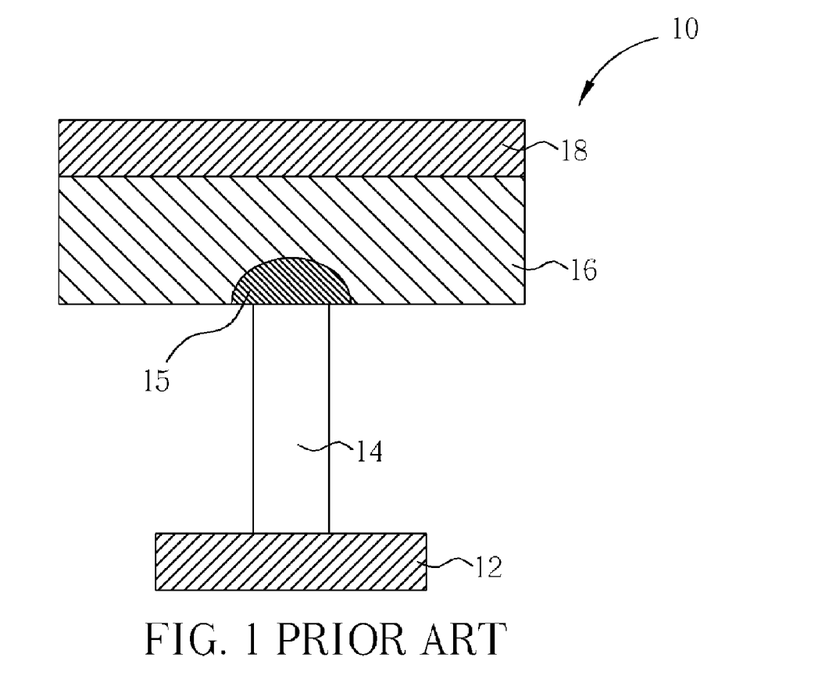
FIG. 1 is a schematic diagram showing a conventional PCM structure.

FIG. 1 shows a cross sectional view of a conventional PCM. The PCM 10 includes a lower electrode 12, a heater 14, a phase change material layer 16, and an upper electrode 18. The active region 15 of the phase change material layer 16 is heated up by the amount of current that flows through the interface between the heater 14 and the phase change material layer 16. The active region 15 of the phase change material layer 16 is changed into an amorphous state or a crystalline state in accordance with the heating efficiency and duration of the current.

For a PCM device, it is desirable to reduce the size of a contact area between the electrode and the phase change material, so as to increase local heating effect. Accordingly, a novel PCM device with a novel heater structure having a small contact area to the phase change material is still desirable.

SUMMARY OF THE INVENTION

One object of the present invention is to provide a method of fabricating a PCM to obtain a PCM comprising a heater structure having a tapered shape with a wide top and a narrow bottom, such that the area for the heater structure to contact the phase change material layer is small, and, furthermore, the fabrication of the PCM and the fabrication of the logic device can be compatible.

The method of fabricating a PCM according to the present invention comprises steps of providing a lower electrode; forming a phase change material pattern on the lower electrode; and forming a taper-shaped heater structure with a bottom portion thereof contacting the phase change material pattern.

The method of fabricating an embedded PCM according to the present invention comprises steps of providing a first MOS transistor in a memory region and a second MOS transistor in a logic region on a substrate, a dielectric layer formed on the memory region and the logic region, and a first contact through the dielectric layer on a source/drain structure of the first MOS transistor and a second contact through the dielectric layer on a source/drain structure of the second MOS transistor; forming a second dielectric layer on the memory region and the logic region; forming a first opening through the second dielectric layer to expose the first contact; filling the first opening with a phase change material, thereby forming a phase change material pattern; forming a third dielectric layer on the second dielectric layer and the phase change material pattern; forming a tapered opening through the third dielectric layer to expose a portion of the phase change material pattern; forming a photo resist layer on the third dielectric layer and filling the tapered opening; patterning the photo resist layer to form a second opening corresponding to the second contact; removing a portion of the third dielectric layer and a portion of the second dielectric layer through the second opening to form a third opening and expose the second contact; removing the photo resist layer; forming a first barrier layer on a side wall and a bottom of the third opening and a side wall and a bottom of the tapered opening; and filling the third opening and the tapered opening with a conductive material.

The PCM according to the present invention comprises a lower electrode; a phase change material pattern electrically connecting to the lower electrode; and a heater structure disposed on the phase change material pattern, wherein the heater structure is in a tapered shape with a bottom portion contacting the phase change material pattern.

These and other objectives of the present invention will no doubt become obvious to those of ordinary skill in the art after reading the following detailed description of the preferred embodiment that is illustrated in the various figures and drawings.

DETAILED DESCRIPTION

Figure 2:
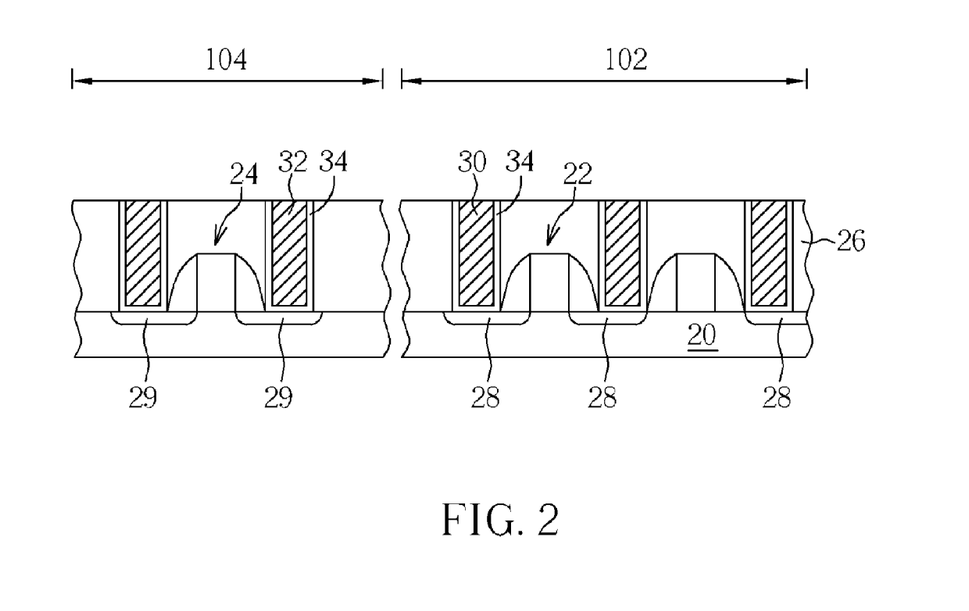
FIGS. 2-10 are schematically cross-sectional diagrams showing an embodiment of the fabrication of a PCM according to the present invention.

Please refer to FIGS. 2-10, which are schematically cross-sectional diagrams showing an embodiment of the fabrication of a PCM according to the present invention. First, as shown in FIG. 2, a semiconductor substrate 20 has a memory region 102 and a logic region 104. A MOS transistor 22 is provided in the memory region 102. A MOS transistor 24 is provided in the logic region 104. There may be more than one MOS transistor disposed in the memory region or in the logic region according to a desired memory layout and functions. The MOS transistors may each comprise a gate structure having a spacer on the side wall, a source/drain structure 28 or 29, and a channel (not shown). A dielectric layer 26 as an inter-layer dielectric is formed on the memory region 102 and the logic region 104 to cover the transistors. An etch stop layer may be further formed between the dielectric layer 26 and the semiconductor substrate 20. A contact 30 is formed through the dielectric layer 26 to contact a source/drain structure 28 of the MOS transistor 22. A contact 32 is formed through the dielectric layer 26 to contact a source/drain structure 29 of the MOS transistor 24. There may be more than one contact formed through the dielectric layer 26 in the memory region 102 and the logic region 104 according to a desired memory layout and a desired logic design. The contacts 30 and 32 comprise at least a conductive material, such as various kinds of metals or polysilicon. For example, tungsten (W), aluminum, or copper is usually used in the semiconductor device. There may be a barrier layer 34 further formed to surround the contact 30 or 32.

Figure 3:
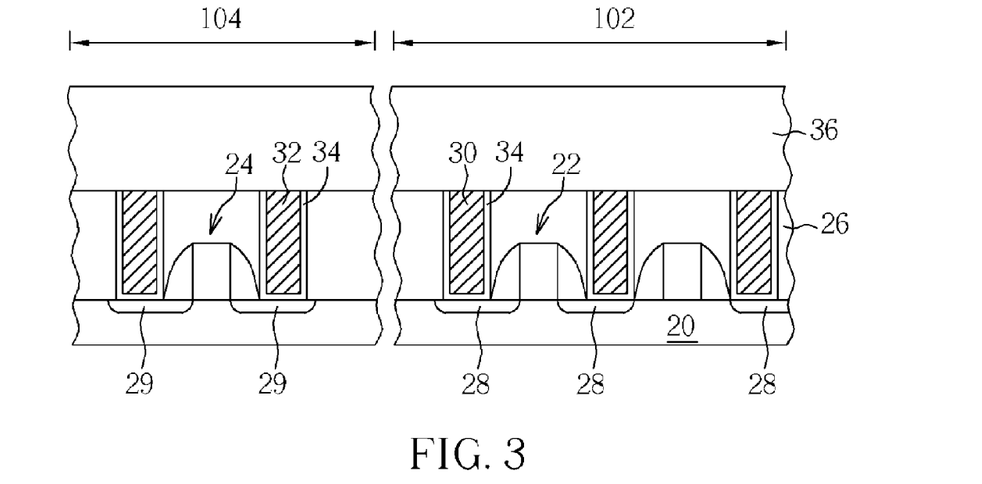
Figure 4:
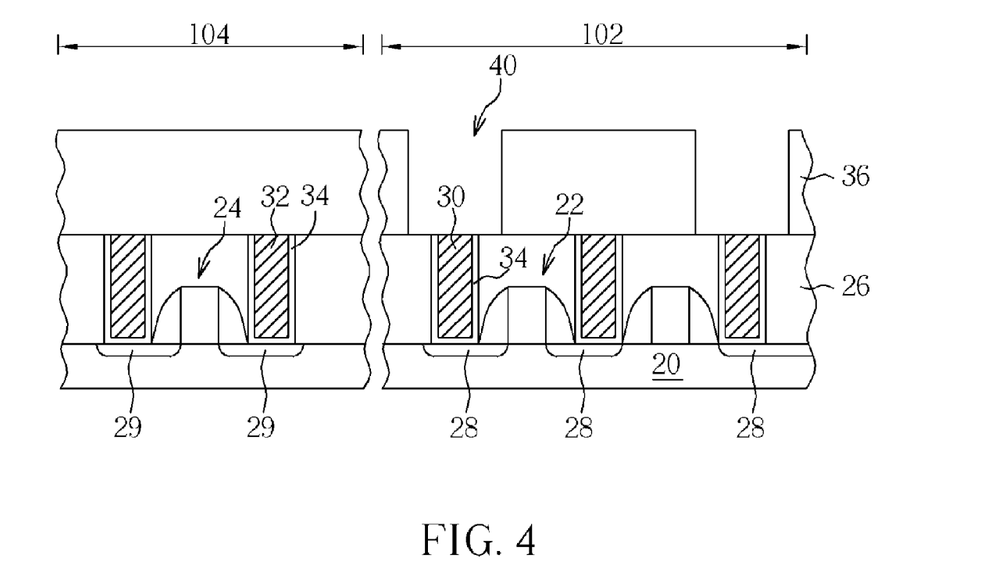

Next, as shown in FIG. 3, a dielectric layer 36 is formed on the memory region 102 and the logic region 104 to cover the dielectric layer 26 and the contacts 30 and 32. The dielectric layer 36 may be a conventional first inter-layer dielectric and formed by a chemical vapor deposition (CVD) process, and may further be planarized by a CMP (chemical mechanical planarization) process. An etch stop layer serving as an etching stop layer may be further formed before the dielectric layer 36 is formed to cover the dielectric layer 26. Thereafter, as shown in FIG. 4, an opening 40 for forming a phase change material pattern is formed through the dielectric layer 36 to expose the contact 30. The opening 40 may be formed by using a lithography process and an etching process. For example, a photo resist layer (not shown) is formed on the dielectric layer 36 and patterned to form an opening at a location corresponding to the contact 30, the portion of the dielectric layer 36 exposed through the opening and the portion of the etch stop layer underlying the portion of the dielectric layer 36 is etched away, such that the contact 30 is exposed.

Figure 5:
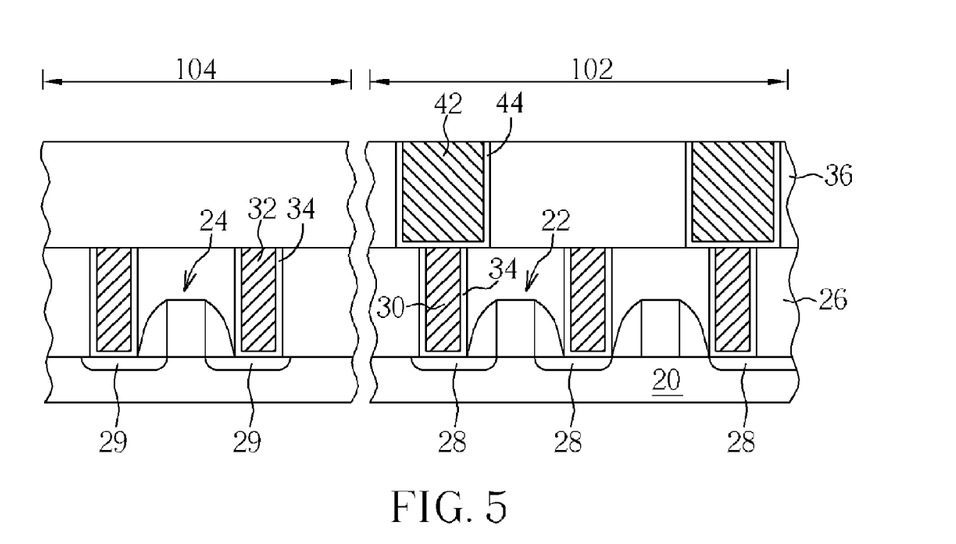

As shown in FIG. 5, the opening 40 is filled up with a phase change material to form a phase change material pattern 42. The phase change material may comprise a compound including a combination of at least one of Te and Se, which are chalcogenide elements, and at least one of Ge, Sb, Bi, Pb, Sn, Ag, As, S, Si, P, O and N, but not limited thereto. For example, the phase change material may be formed of a compound containing Ge—Sb—Te, As—Sb—Te, As—Ge—Sb—Te, Sn—Sb—Te, Ag—In—Sb—Te, In—Sb—Te, an element in a group 5A-Sb—Te, an element in a group 6A-Sb—Te, an element in a group 5A-Sb—Se or an element in a group 6A-Sb—Se. The phase change material may be doped with $N_2$ or $O_2$, to adjust the phase change temperature. A specific example of the phase change material is $Ge_2Sb_2Te_5:O_2/N_2$. A barrier layer 44 may be formed on the side wall and the bottom of the opening 40 before the phase change material is deposited into the opening 40, such that after the phase change material is filled in the opening 40, the barrier layer 44 will surround the phase change material pattern 42. Forming the barrier layer 44 is advantageous that the electric current flowing through the phase change material can be increased and that the barrier layer 44 can serve as a barrier to inhibit the intrusion of water vapor into the phase change material pattern and inhibit the out diffusion of the $N_2$ or $O_2$ dopants from the phase change material pattern 42. The opening 40 may be filled up with the phase change material by, for example, a sputtering process to deposit a layer of the phase change material into the opening 40, and a chemical-mechanical polishing (CMP) process may be performed to remove excess phase change material on the top of the dielectric layer 36 and to planarize the top surface of the phase change material pattern 42.

Figure 6:
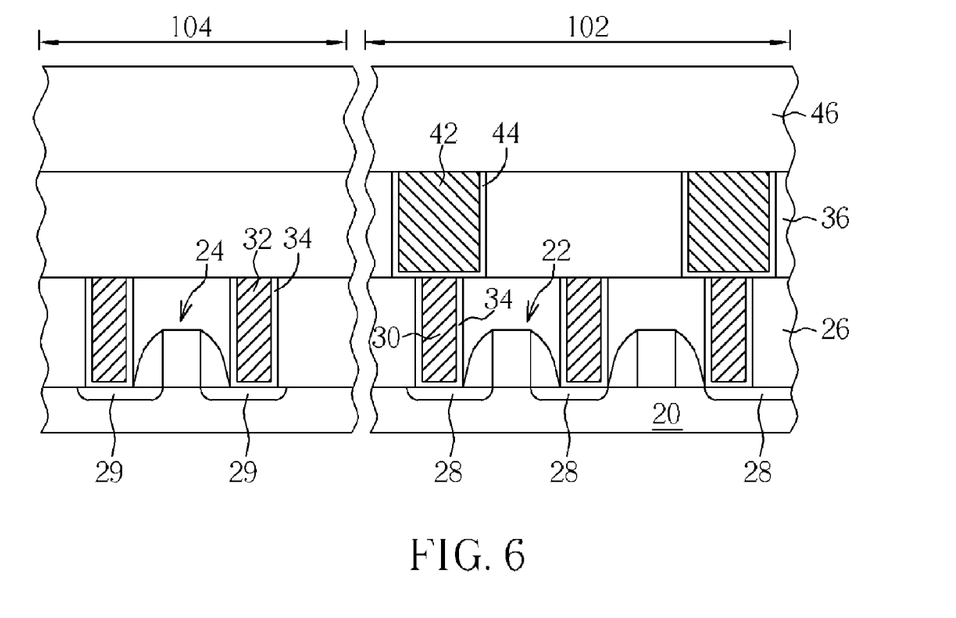

Thereafter, as shown in FIG. 6, a dielectric layer 46 is formed to cover the dielectric layer 36 and the phase change material pattern 42. Similarly, the dielectric layer 46 can comprise one or more dielectric materials such as silicon oxide and low-k (low dielectric constant) material. An etch stop layer may be further formed beneath the dielectric layer 46 to serve as an etching stop layer.

Figure 7:
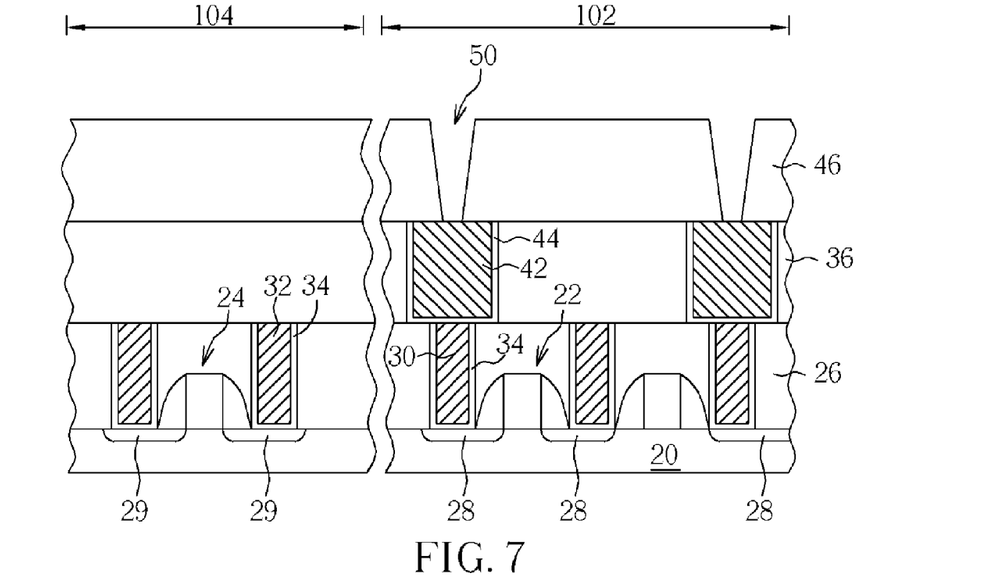

Thereafter, as shown in FIG. 7, a tapered opening 50 is formed through etching the dielectric layer 46 and the etch stop layer to expose a portion of the phase change material pattern 42. The tapered opening 50 may be formed by using a lithography process and an etching process. For example, a photo resist layer (not shown) is formed on the dielectric layer 46 and patterned to form an opening at a location corresponding to the phase change material pattern 42, the portion of the dielectric layer 46 exposed through the opening and the portion of the etch stop layer underlying the portion of the dielectric layer 46 is etched away, such that a portion of the phase change material pattern 42 is exposed. The tapered opening 50 may be accomplished by, for example, an anisotropic dry etching technique, but not limited thereto, such that the opening can be formed in a tapered shape. For example, when the dielectric layer 46 is silicon oxide, it may be etched by using at least one low F/C (fluorine to carbon) ratio gas from $C_4H_8$, $C_2F_6$, $C_2F_8$, $CHF_3$, $CH_3F$, and $CH_2F_2$ and an optional gas from CO, $H_2$, $CH_4$, and Ar as an etching gas and using the patterned photo resist layer as a mask. The tapered opening 50 is prepared for forming a heater structure of the PCM device in later steps.

Figure 8:
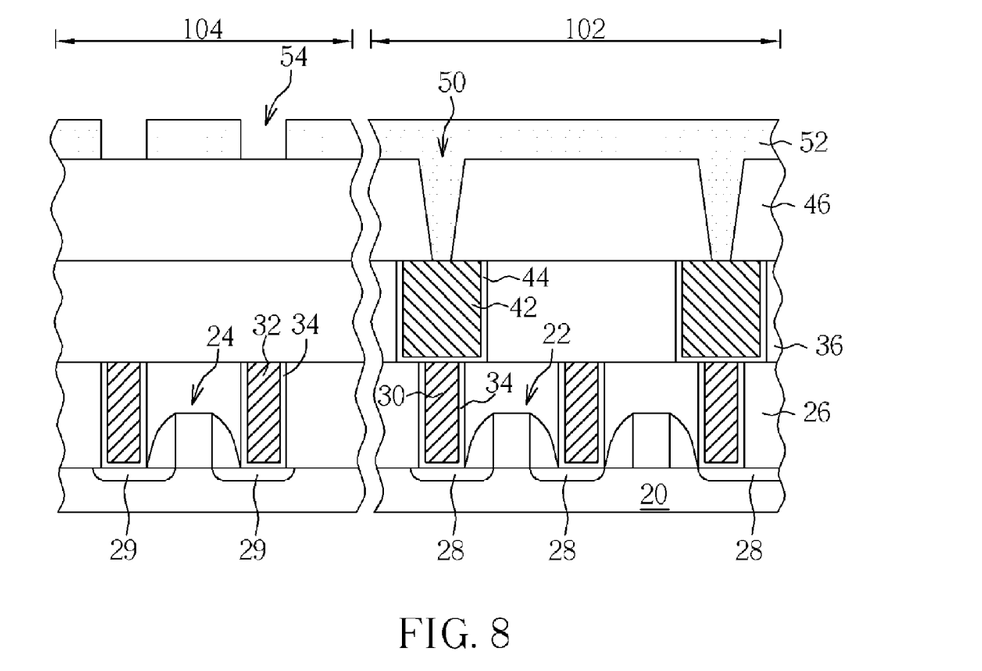
Figure 9:
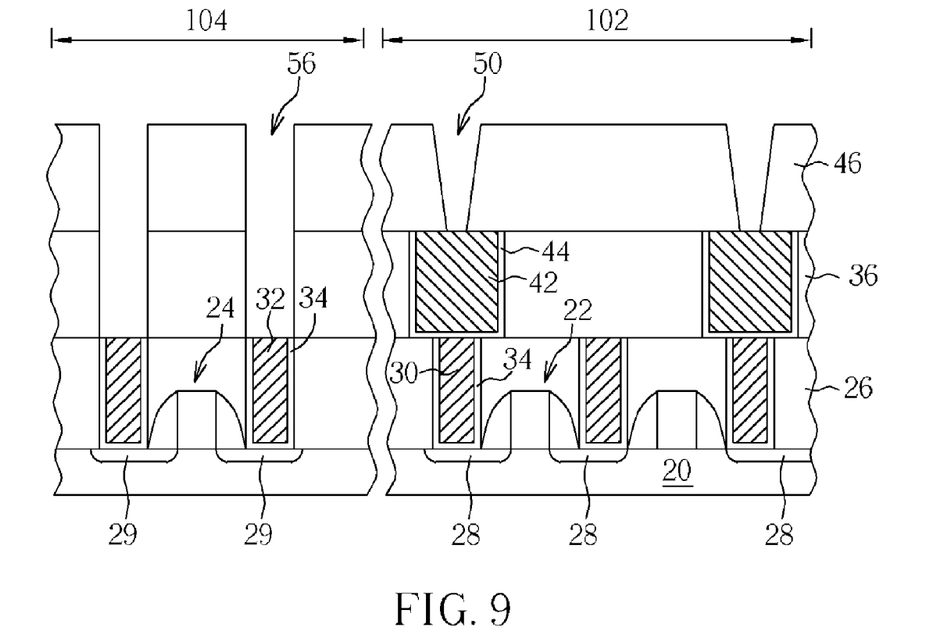

Subsequently, as shown in FIG. 8, a photo resist layer 52 is formed on the dielectric layer 46 and filled into the tapered opening 50. The photo resist layer 52 is then patterned to form an opening 54 at a location corresponding to the contact 32. Thereafter, referring to FIG. 9, a portion of the dielectric layer 46, the etch stop layer, the dielectric layer 36, and the etch stop layer are removed through the opening 54 to form an opening 56, and accordingly the contact 32 is exposed. The removal may be accomplished by etching using the photo resist layer 52 after patterned as a mask. The memory region 102 is well protected by the photo resist layer 52 during the removal. Thereafter, the photo resist layer 52, including the portion filled in the tapered opening 50, is removed.

Figure 10:
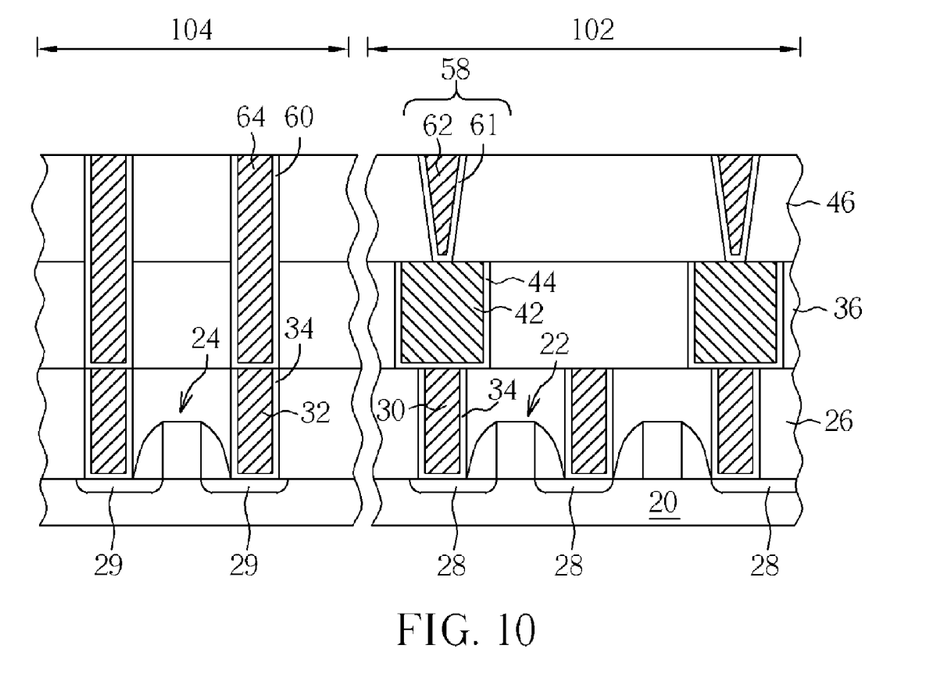

Referring to FIG. 10, a heater structure 58 for the phase change material pattern 42 is formed simultaneously with the formation of a contact 64. The barrier layers 60 and 61 are respectively formed on a side wall and a bottom of the opening 56 and a side wall and a bottom of the tapered opening 50. Thereafter, the opening 56 and the tapered opening 50 with the barrier layers 60 and 61 formed on their side walls and bottoms are filled with a conductive material, and a CMP process may be performed to remove excess conductive material, to form a contact 64 and an electrode 62, such that a PCM is accomplished. The heater structure 58 accordingly formed comprises the barrier layer 61 and the electrode 62. The conductive material may be, for example, metal, such as tungsten, aluminum, or copper.

The heater structure 58 thus obtained is in a tapered shape with a bottom surface contacting the phase change material pattern 42. The electrode 62 is also referred to as "upper electrode". The heater structure 58 with a tapered shape has a relatively small area to contact the phase change material pattern, so as to improve the local heating effect.

The barrier layers 34, 44, 60 and 61 may each independently comprise metal such as titanium or tantalum, metal nitride such as titanium nitride, tantalum nitride, tungsten nitride, or titanium nitride aluminum, or a combination thereof, but not limited thereto, and may be formed by, for example, a PVD (physical vapor deposition) process. The etch stop layers may each independently comprise SiN, SiCN, SiC, SiON, or a combination thereof, and each serves as an etching stop layer during an etching process. The dielectric layers 26, 36, and 46 may each independently comprise one or more dielectric materials such as silicon oxide and low-k (low dielectric constant) material.

Figure 11:
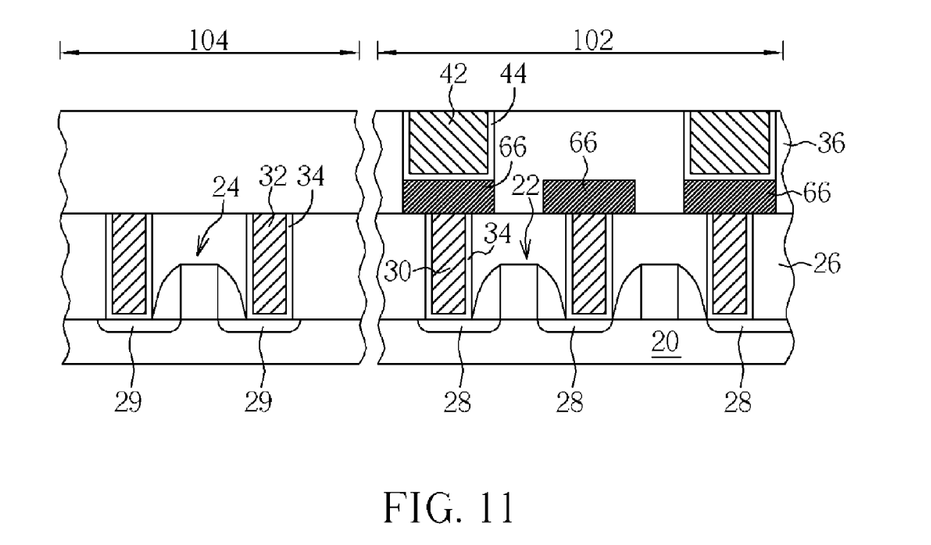
FIG. 11 is a schematically cross-sectional diagram showing another embodiment of the fabrication of a PCM according to the present invention.

In another embodiment according to the present invention, a metal layer may be further formed on the contacts 30 and 32. Please refer to FIG. 11. The metal layer 66 is formed on each of the contacts 30. The metal layer 66 on the contact 30 on the drain structure of the MOS transistor 22 is electrically connected to a ground potential. The metal layer 66 on the source structure of the MOS transistor 22 may serve as the lower electrode of the PCM. The metal layer 66 may be formed by for example a damascene process. An etch stop layer (not shown) may be formed to cover the dielectric layer 26 before the dielectric layer 36 is formed. After the metal layer 66 is formed, the phase change material pattern 42 is formed on the contacts 30 on the drain structure of the MOS transistor 22 also by a damascene process. Before the phase change material pattern 42 is formed, a barrier layer 44 may be formed on the side wall and the bottom of the opening for the phase change material pattern 42. Thereafter, the following processes are similar to those shown by FIGS. 6-10 to form a PCM according to the present invention.

Figure 12:
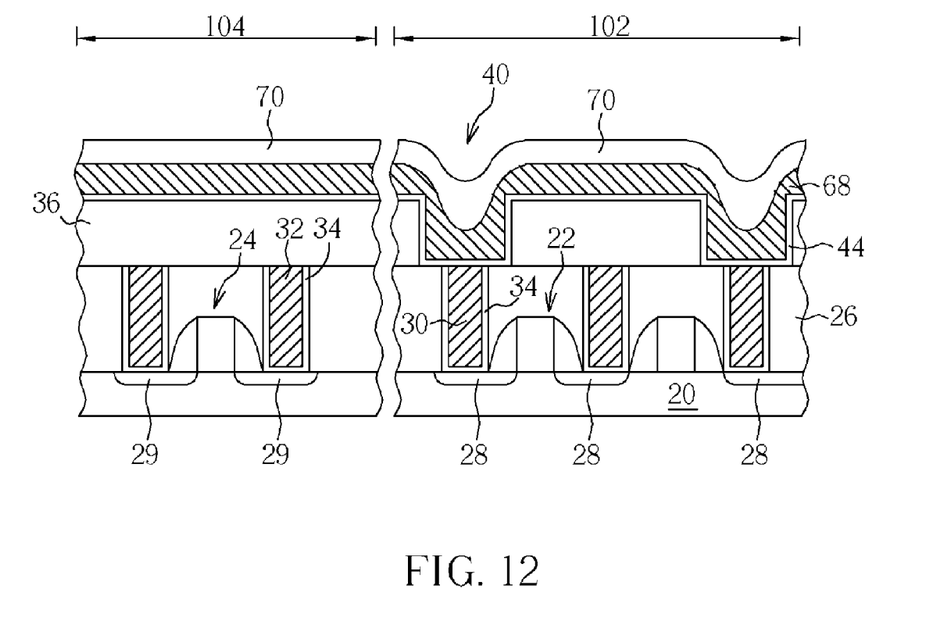
FIGS. 12-14 are schematically cross-sectional diagrams showing still another embodiment of the fabrication of a PCM according to the present invention.
Figure 13:
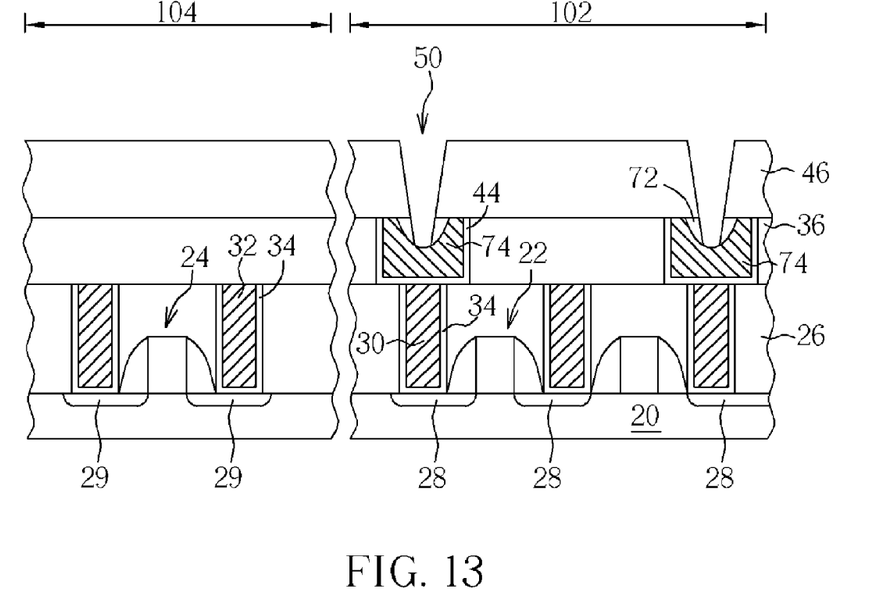
Figure 14:
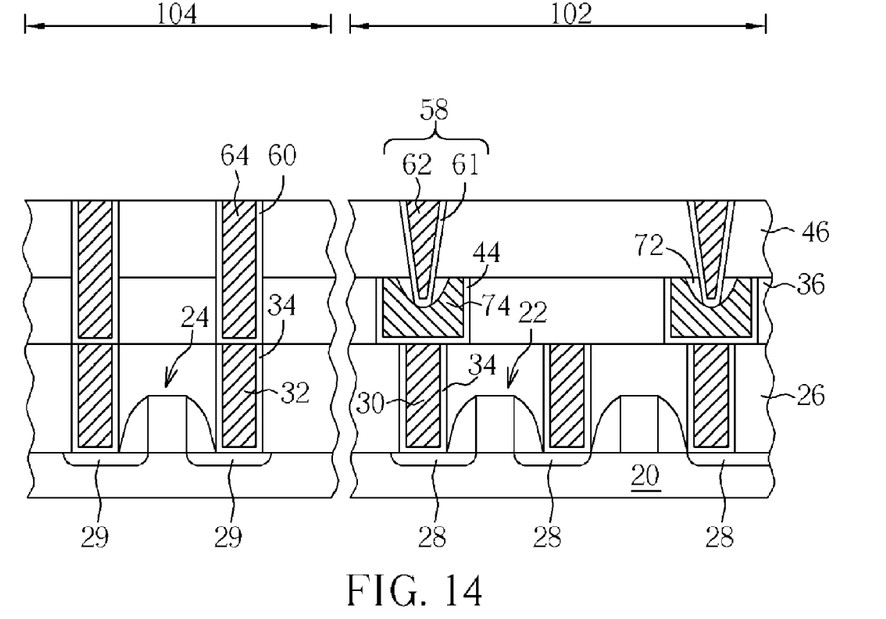

In still another embodiment according to the present invention, a protective layer may be further formed on the phase change material in the opening 40 for protection. Please refer to FIG. 12, showing steps following the step of forming the opening 40 as shown in FIG. 4. A barrier layer 44, a phase change material layer 68, and a dielectric material layer 70 are formed in such order in the opening 40. It is noted that when the phase change material layer 68 is filled into the opening 40, it is not fully but only partially filled in the opening 40, to leave a space on the top of the opening 40. Thereafter, the dielectric material layer 70 comprising for example SiN is deposited into the opening 40 to fill up the opening 40. Thereafter, a CMP process is performed to remove excess portions of the barrier layer 44, the phase change material layer 68, and the dielectric material layer 70 above the top of the opening 40, resulting a cap protection layer 72 on the phase change material pattern 74 within the opening. Accordingly, the central portion of the phase change material pattern 74 is substantially formed without experiencing the planarization. Thereafter, as shown in FIG. 13, an etch stop layer (not shown) may be further formed to cover the dielectric layer 36 and the cap protection layer 72, and a dielectric layer 46 is formed. Thereafter, a tapered opening 50 is formed through etching the dielectric layer 46, the etch stop layer, and the cap protection layer 72, in a same way as described above, to expose a portion of the phase change material pattern 74. Thereafter, the following steps are similar to those shown by FIGS. 8-10 to form a PCM according to the present invention as shown in FIG. 14.

The phase change material pattern is formed by a "damascene process". Since the damascene process is adopted, it is possible to form a barrier layer before the phase change material is deposited, to allow the barrier layer to surround the phase change material pattern and protect the phase change material pattern from moisture and impurity.

Furthermore, in the present invention, the contact 64 and the electrode 62 comprise the same material, and they can be formed simultaneously in the same processing step. Similarly, the barrier layer 60 for the contact 64 and the barrier layer 61 for the heater structure 58 comprise the same material, and they can also be formed simultaneously in the same processing step. In addition, the lower electrode, i.e. the contact 30 in the memory region and the contact 32 in the logic region are also formed simultaneously in one processing step. Thus, the fabrication of the logic device and the fabrication of the memory device are well compatible in the present invention.

Furthermore, it should be noted that, the lower electrode of the phase change memory is not limited to be the contact, but may be any layer of metal depending on the circuit layout. Furthermore, the lower electrode may connect to the source or the drain of the transistor, but not limited thereto, i.e. it may connect to any interconnect. Moreover, a plurality of PCMs may be electrically connected to one same transistor. Or, a PCM may be not electrically connected to any transistor.

All combinations and sub-combinations of the above-described features also belong to the present invention. Those skilled in the art will readily observe that numerous modifications and alterations of the device and method may be made while retaining the teachings of the invention.

What is claimed is:

1. A method of fabricating a phase change memory, comprising:
   providing a lower electrode;
   forming a first dielectric layer on the lower electrode;
   etching the first dielectric layer to form a first opening to expose the lower electrode;
   filling the first opening with a phase change material to form a phase change material pattern on the lower electrode;
   forming a second dielectric layer on the first dielectric layer and the phase change material pattern;
   etching the second dielectric layer to form a second opening to expose the phase change material pattern, wherein the second opening has a tapered shape; and
   filling the second opening with a heater material, thereby to form a taper-shaped heater structure with a bottom portion contacting the phase change material pattern.

2. The method of claim 1, wherein the lower electrode comprises a contact, via, interconnect, or a combination thereof.

3. The method of claim 1, wherein the taper-shaped heater structure comprises a conductive material and a barrier layer surrounding the conductive material.

4. The method of claim 1, wherein the phase change material pattern comprises a compound comprising at least one of Te and Se and at least one of Ge, Sb, Bi, Pb, Sn, Ag, As, S, Si, P, O and N.

5. The method of claim 1, further comprising forming a barrier layer surrounding the phase change material pattern.

6. The method of claim 5, wherein the barrier layer comprises metal, metal nitride, or a combination thereof.

7. The method of claim 1, further comprising forming a cap protection layer on the phase change material pattern, wherein the taper-shaped heater structure is formed through the cap protection layer to contact the phase change material pattern.

8. A method of fabricating an embedded phase change memory, comprising:
   providing a first MOS transistor in a memory region and a second MOS transistor in a logic region on a substrate, a dielectric layer formed on the memory region and the logic region, and a first contact through the dielectric layer on a source/drain structure of the first MOS transistor and a second contact through the dielectric layer on a source/drain structure of the second MOS transistor;

forming a second dielectric layer on the memory region and the logic region;

forming a first opening through the second dielectric layer to expose the first contact;

filling the first opening with a phase change material, thereby forming a phase change material pattern;

forming a third dielectric layer on the second dielectric layer and the phase change material pattern;

forming a tapered opening through the third dielectric layer to expose a portion of the phase change material pattern;

forming a photo resist layer on the third dielectric layer and filling the tapered opening;

patterning the photo resist layer to form a second opening corresponding to the second contact;

removing a portion of the third dielectric layer and a portion of the second dielectric layer through the second opening to form a third opening and expose the second contact;

removing the photo resist layer;

forming a first barrier layer on a side wall and a bottom of the third opening and a side wall and a bottom of the tapered opening; and filling the third opening and the tapered opening with a conductive material, thereby forming a third contact connecting the second contact on the source/drain structure of the second MOS transistor and a tapered heater respectively.

9. The method of claim 8, further comprising forming a second barrier layer on a side wall and a bottom of the first opening to surround the phase change material pattern.

10. The method of claim 9, wherein the second barrier layer comprises titanium, tantalum, titanium nitride, tantalum nitride, tungsten nitride, titanium nitride aluminum, or a combination thereof.

11. The method of claim 9, wherein the step of filling the first opening with the phase change material is performed such that the first opening has a space remaining on the top of the phase change material, a cap protection layer is further formed on the phase change material pattern to fill the space in the first opening, and the step of forming the tapered opening is performed such that the tapered opening is further through the cap protection layer.

12. The method of claim 8, wherein the phase change material pattern comprises a compound comprising at least one of Te and Se and at least one of Ge, Sb, Bi, Pb, Sn, Ag, As, S, Si, P, O and N.

13. The method of claim 8, wherein the first barrier layer comprises titanium, tantalum, titanium nitride, tantalum nitride, tungsten nitride, titanium nitride aluminum, or a combination thereof.

14. A phase change memory, comprising:
a lower electrode;
a phase change material pattern electrically connecting to the lower electrode; and
a heater structure disposed on the phase change material pattern, wherein the heater structure is in a tapered shape with a bottom portion contacting the phase change material pattern and the heater structure comprises a conductive material and a first barrier layer surrounding the conductive material.

15. The phase change memory of claim 14, wherein the lower electrode comprises a contact, via, interconnect, or a combination thereof.

16. The phase change memory of claim 14, wherein the phase change material pattern comprises a compound comprising at least one of Te and Se and at least one of Ge, Sb, Bi, Pb, Sn, Ag, As, S, Si, P, O and N.

17. The phase change memory of claim 14, further comprising a second barrier layer surrounding the phase change material pattern.

18. The phase change memory of claim 17, wherein the second barrier layer comprises titanium, tantalum, titanium nitride, tantalum nitride, tungsten nitride, titanium nitride aluminum, or a combination thereof.

19. The phase change memory of claim 14, further comprising a cap protection layer on the phase change material pattern, wherein the heater structure is with the bottom portion through the cap protection layer to contact the phase change material pattern.

* * * * *